United States Patent [19]

Bigelow et al.

[11] Patent Number: 5,364,423
[45] Date of Patent: Nov. 15, 1994

[54] METHOD FOR MAKING DIAMOND GRIT AND ABRASIVE MEDIA

[75] Inventors: Louis K. Bigelow, Harvard, Mass.; Frank J. Csillag, Salt Lake City, Utah; James T. Hoggins, Plano, Tex.

[73] Assignee: Norton Company, Worcester, Mass.

[21] Appl. No.: 59,014

[22] Filed: May 6, 1993

Related U.S. Application Data

[63] Continuation of Ser. No. 614,900, Nov. 16, 1990, abandoned.

[51] Int. Cl.$^5$ .............................................. B24D 3/00
[52] U.S. Cl. .................................... 51/293; 51/298; 51/307; 51/295; 427/249; 427/122; 427/577; 427/132; 427/255.5; 423/446
[58] Field of Search ................. 51/293, 298, 307, 309, 51/308, 295; 427/249, 255.5, 122, 577, 132; 423/446

[56] References Cited

U.S. PATENT DOCUMENTS

| | | | |
|---|---|---|---|
| 3,929,432 | 12/1975 | Caveney | 51/295 |
| 4,434,188 | 2/1984 | Kamo et al. | 427/39 |
| 4,471,003 | 9/1984 | Cann | 427/34 |
| 4,487,162 | 12/1984 | Cann | 118/723 |
| 4,507,588 | 3/1985 | Asmussen et al. | 315/39 |
| 4,585,668 | 4/1986 | Asmussen et al. | 427/38 |
| 4,630,566 | 12/1986 | Asmussen et al. | 118/50.1 |
| 4,691,662 | 9/1987 | Roppel et al. | 118/50.1 |
| 4,752,504 | 6/1988 | Rickborn | 427/249 |
| 4,776,861 | 10/1988 | Frushour | 51/293 |
| 4,828,582 | 5/1989 | Frushour | 51/293 |
| 4,832,705 | 5/1989 | Davies et al. | 51/293 |
| 4,913,090 | 4/1990 | Harada et al. | 118/724 |
| 4,987,002 | 1/1991 | Sakamoto et al. | 427/34 |
| 5,024,680 | 6/1991 | Chen et al. | 51/295 |
| 5,061,292 | 10/1991 | Chen et al. | 51/293 |
| 5,070,274 | 3/1990 | Yoshikawa et al. | 315/111.21 |

FOREIGN PATENT DOCUMENTS 63-289926 11/1988 Japan .
1-242141 9/1989 Japan .
1-312008 12/1989 Japan .

OTHER PUBLICATIONS

Ohtake et al., "Application Of CVD Diamond Grains Fabricated By Roll Milling To Grinding Wheels", Second International Conference On The New Diamond Science And Technology (Sep. 28, 1990) pp. 1–6.

DeBeers Brochure "CDA-L"-Carbide Diamond Abrasive-Long (1989) pp. 1–3.

N. Savvides, "Diamond Growth From the Vapor Phase", Materials Science Forum, pp. 487–495, Trans Tech Publications, Ltd. (1988).

B. V. Derjaguin et al., "The Synthesis of Diamond at Low Pressure" Scientific American, vol. 233 No. 11 pp. 102–109 (1975).

P. D. Gigl, "New Synthesis Techniques, Properties, And Applications For Industrial Diamond", IDA Ultrahard Materials Seminar, Toronto, Canada (Sep., 1989) pp. 1–23.

"Diamond And Diamond-Like Coatings: A Techno-Economic Assessment", Gorham Advanced Materials Institute, vol. 1, title page and pp. 5-22–5-40.

B. V. Spitzyn, L. L. Boulov, and B. V. Derjaguin, "Diamond And Diamond-Like Films: Deposition From The Vapor Phase, Structure And Properties", Progress in Crystal Growth and Characterization 17, pp. 79–170 (1988).

J. C. Angus et al., "Diamond Growth at Low Pressures", MRS Bulletin, Oct./1989, pp. 38–48.

Primary Examiner—Roy V. King
Attorney, Agent, or Firm—Volker R. Ulbrich; Martin Novack

[57] ABSTRACT

Synthetic diamond film produced by chemical vapor deposition can be crushed to obtain diamond grit which has useful abrasive properties. The flexibility of CVD deposition processes in determining diamond film properties means that CVD diamond grit properties can be tailored to particular abrasive applications. In a disclosed embodiment, the grit particles are coated with a magnetic material. The coated grit particles can then be aligned with a magnetic field, and the coated grit particles are bonded to a matrix while aligned. In a further disclosed form of the invention, a chemical vapor deposition system, such as an arc jet plasma deposition system, is provided in a chamber.

19 Claims, 5 Drawing Sheets

METHOD FOR MAKING DIAMOND GRIT AND ABRASIVE MEDIA

This is a continuation of U.S. application Ser. No. 614,900, filed Nov. 16, 1990, now abandoned.

BACKGROUND OF THE INVENTION

This invention relates to the field of abrasives and, more particularly, to synthetic diamond grit, abrasive media produced using synthetic diamond grit, and methods and apparatus for making synthetic diamond grit and other superabrasive grit.

The use of natural diamond grit for applications such as polishing and for cutting and grinding wheels is very old. In addition to the limitations of high cost, natural diamond grit cannot be readily provided with characteristics that are "tailored" for particular abrasive applications. Also, for some abrasive uses, a limitation of natural diamond is the difficulty of obtaining the grit in an elongated or high aspect ratio configuration that is advantageous for certain applications.

Experiments aimed at creation of synthetic or artificial diamond from carbonaceous material were performed as early as the nineteenth century. It was not until the 1950's, however, that successful synthesis of diamond was achieved. The synthesis technique was a so-called high-pressure high-temperature ("HP-HT") method wherein diamond is produced by highly compressing carbon, in the form of graphite, at high temperature in the presence of a catalyst. HP-HT techniques are currently used to synthesize diamond for various uses, and HP-HT diamond is presently the dominant source of diamond grit for abrasive media.

HP-HT diamond can be produced with characteristics tailored, to some extent, for particular abrasive grit applications; for example, by selecting synthesis conditions to obtain desired morphology, shape and/or defect distribution that will result in a desirable friability for a particular grinding application. However, HP-HT processes generally use a metallic catalyst such as nickel, iron or cobalt, and the resultant HP-HT diamond may contain substantial metallic inclusions that can introduce undesirable operating properties in abrasive media made with HP-HT diamond. For instance, the inclusion of cobalt leads to conversion of the diamond material to graphite at elevated temperatures, which may be encountered near the cutting edge of diamond film cutting tools.

It is among the objects of the present invention to provide a method of making diamond grit that is substantially free of metal inclusions and which has properties that can be tailored toward particular abrasive media applications. It is also among the objects of the present invention to provide an apparatus for making diamond grit and other superabrasive grit.

SUMMARY OF THE INVENTION

Chemical vapor deposition of diamond, which as used herein means growth of diamond from a gaseous hydrocarbon in the presence of a second, facilitating gas, such as hydrogen, is a rapidly developing technique for synthesizing diamond. [See, for example, U.S. Pat. No. 4,434,188; N. Savvides, "Diamond Growth From the Vapor Phase", Materials Science Forum, pp. 487–495, Trans Tech Publications, Ltd. (1988); B. V. Derjaguin et al., "The Synthesis of Diamond at Low Pressure" Scientific American, Vol. 233 No. 11 pp. 102–109 (1975); J. C. Angus et al., "Diamond Growth At Low Pressures", MRS Bulletin, pp. 38–47, (October, 1989); and P. D. Gigl, "New Synthesis Techniques, Properties And Applications For Industrial Diamond", IDA Ultrahard Materials Seminar, Toronto, Ontario, September, 1989.] Various chemical vapor disposition ("CVD") techniques have been proposed and/or used, as described in the documents just listed, including hot filament CVD techniques, flame CVD techniques, UV-assisted CVD techniques, and plasma CVD techniques (including microwave plasma and plasma jet approaches).

Applicants have discovered that diamond film produced by chemical vapor deposition can be crushed to obtain diamond grit which is substantially free of the catalytic solvent metal inclusions generally found in HP-HT diamond grit, and which has useful abrasive properties. The flexibility of CVD deposition processes in determining diamond film properties means that CVD diamond grit properties can be tailored to particular abrasive applications. Also, as CVD diamond deposition technology advances, the cost of CVD diamond is expected to drop. In an embodiment of a form of the invention, a diamond film is produced by providing a substrate, generating a plasma comprising free carbon and atomic hydrogen, and exposing the substrate to the plasma. In this embodiment, the step of producing a diamond film comprises forming a film having a thickness in the range 10 to 1000 microns, and the step of crushing the film comprises crushing to obtain grit particles, a substantial portion of which have an aspect ratio of at least 2:1. This form of the invention is further directed to a method of making an abrasive medium which comprises the additional steps of providing a matrix and bonding the previously obtained grit to the matrix. In an embodiment of this form of the invention, the grit particles are coated with a magnetic material. The coated grit particles can then be aligned with a magnetic field, and the coated grit particles are bonded to the matrix while in the aligned condition.

In accordance with a further form of the invention, a method and an apparatus are set forth for making diamond grit. A chemical vapor deposition system, such as an arc jet plasma deposition system, is provided. A carrier strip and the deposition system are moved with respect to each other, and the deposition system is caused to deposit diamond film on the carrier strip. The diamond film is removed from the carrier strip, such as by flexing the strip, and the film is crushed to obtain diamond grit. In a disclosed embodiment of this form of the invention, the strip has a release agent upon which the film is deposited, and the step of removing the film comprises causing release of the release agent. The strip can be of a flexible material, such as a copper or woven graphite material, and can be wound onto supply and take-up spools, respectively, before and after diamond deposition. The method and apparatus can also be used to produce other superabrasive grit, such as cBN, $C_3N_4$ or $B_2O$.

Further features and advantages of the invention will become more readily apparent from the following detailed description when taken in conjunction with the accompanying drawings.

DESCRIPTION OF THE PREFERRED EMBODIMENTS

Figure 1:
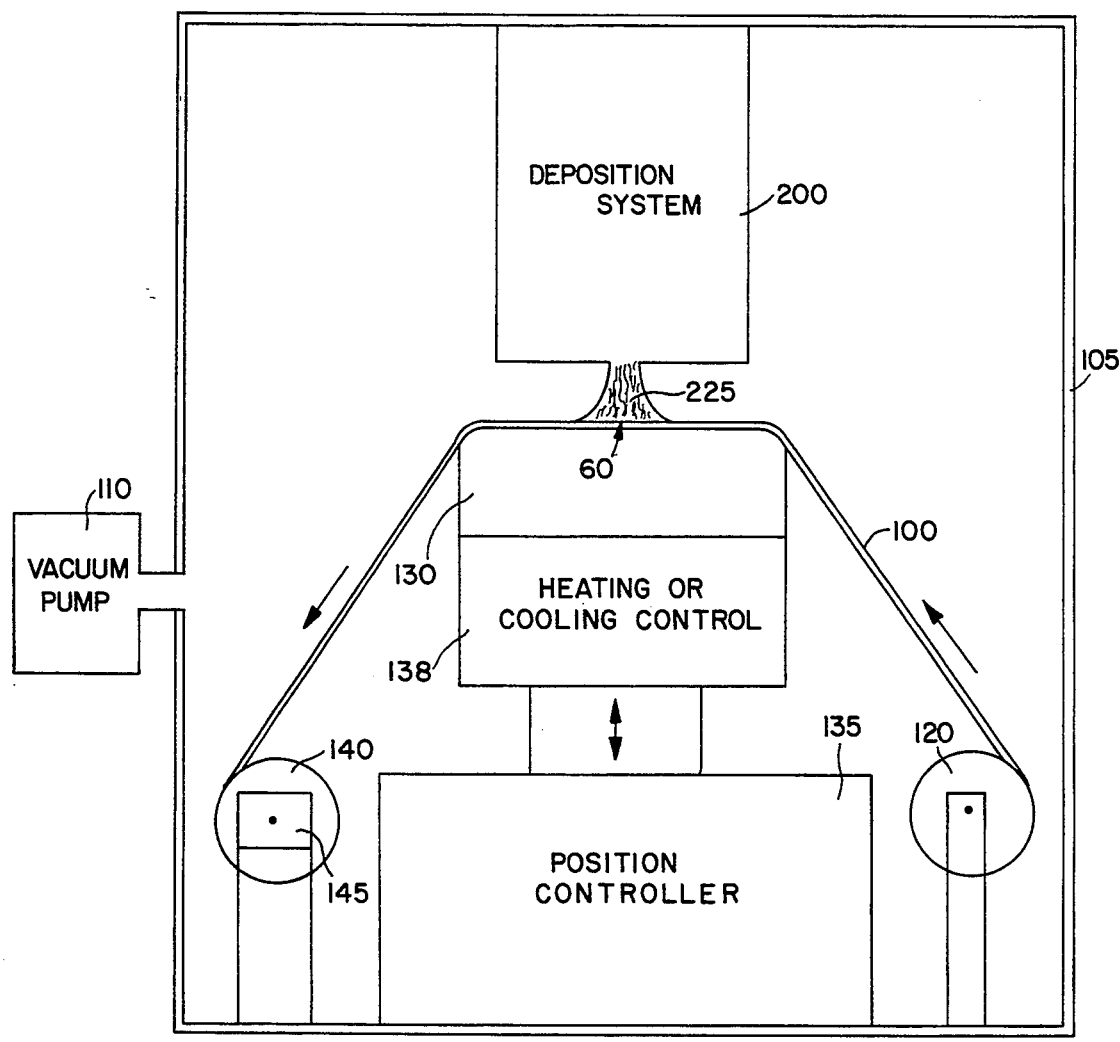
FIG. 1 is a cross-sectional schematic diagram of an apparatus in accordance with an embodiment of the invention and which can be used to practice an embodiment of the method of the invention.

Referring to FIG. 1, there is shown an embodiment of an apparatus in accordance with the invention and which can be used to practice an embodiment of a method of the invention. A chamber 105 is evacuated by a vacuum pump 110. A tensioned supply spool 120 is mounted in the chamber and has wound thereon a carrier strip 100 which should preferably be of a flexible and rugged material having a melting temperature sufficiently high to withstand the deposition temperature. The strip may be, for example, of a woven graphite fabric or a flexible metal, such as a copper strip that is sufficiently thin to deter buckling or stressing, and sufficiently thick to provide ruggedness. For example, a copper strip having thickness in the range 0.001 to 0.01 inches can be utilized. The width of the strip can depend on the size of the deposition region for the deposition equipment (or equipments) to be described.

Figure 4:
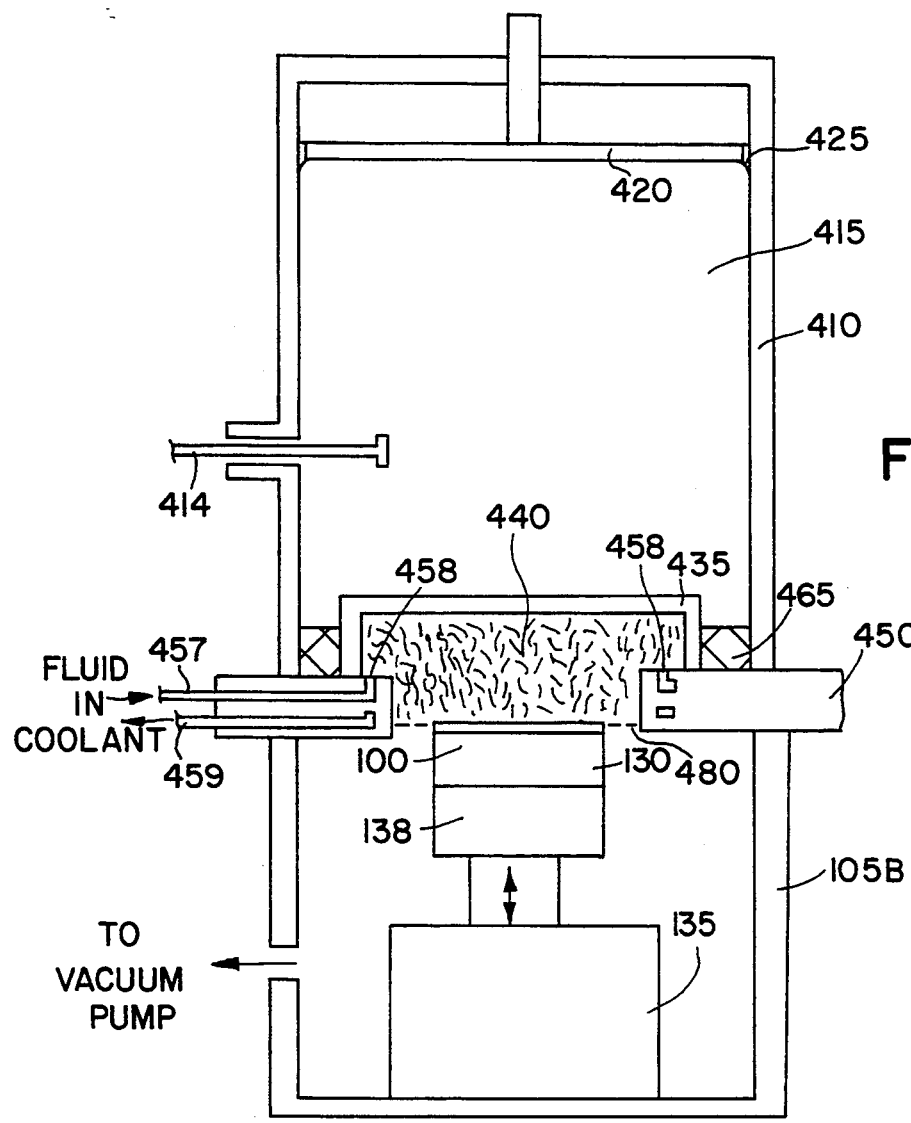
FIG. 4 illustrates a microwave plasma deposition system which can be utilized in the FIG. 1 apparatus.
Figure 5:
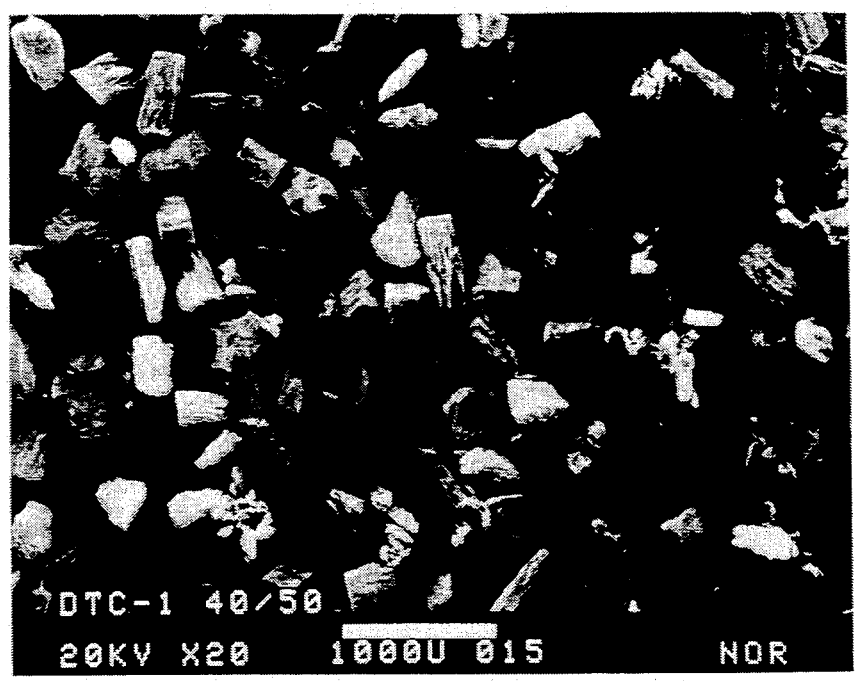
FIGS. 5, 6, 7 and 8 show scanning electron microscope pictures of synthetic diamond grit as obtained in a described example hereof.
Figure 6:
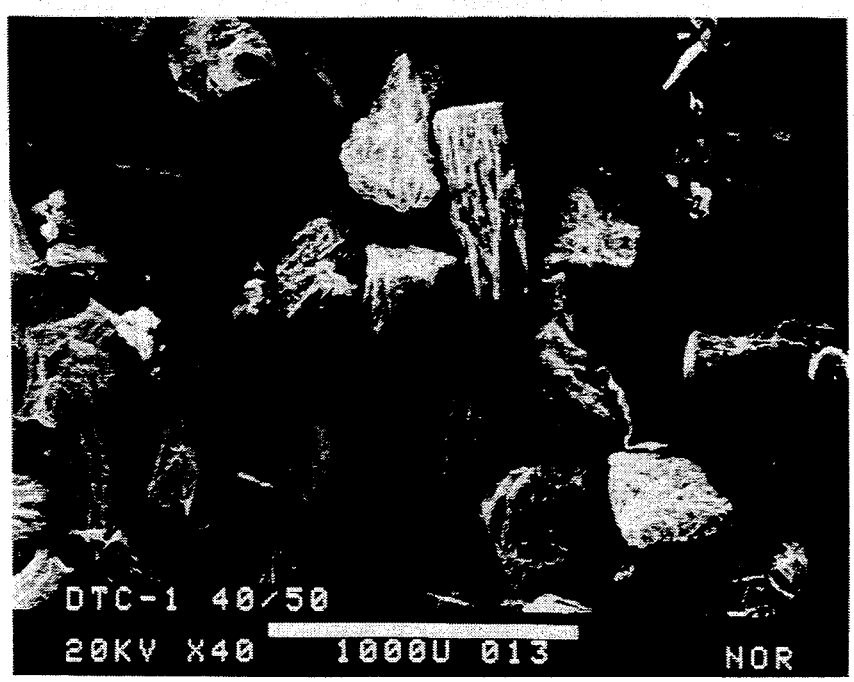
Figure 7:
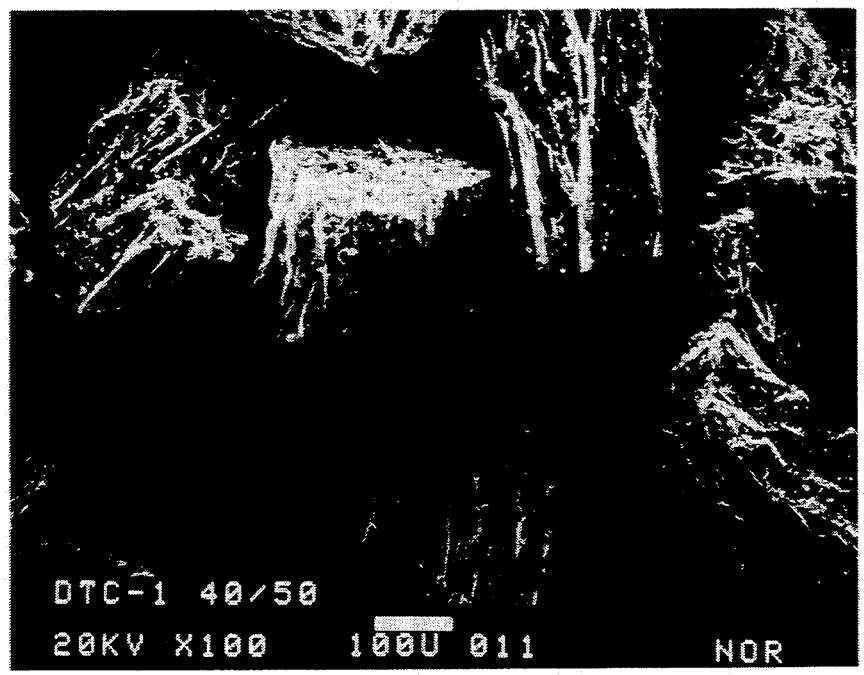
Figure 8:
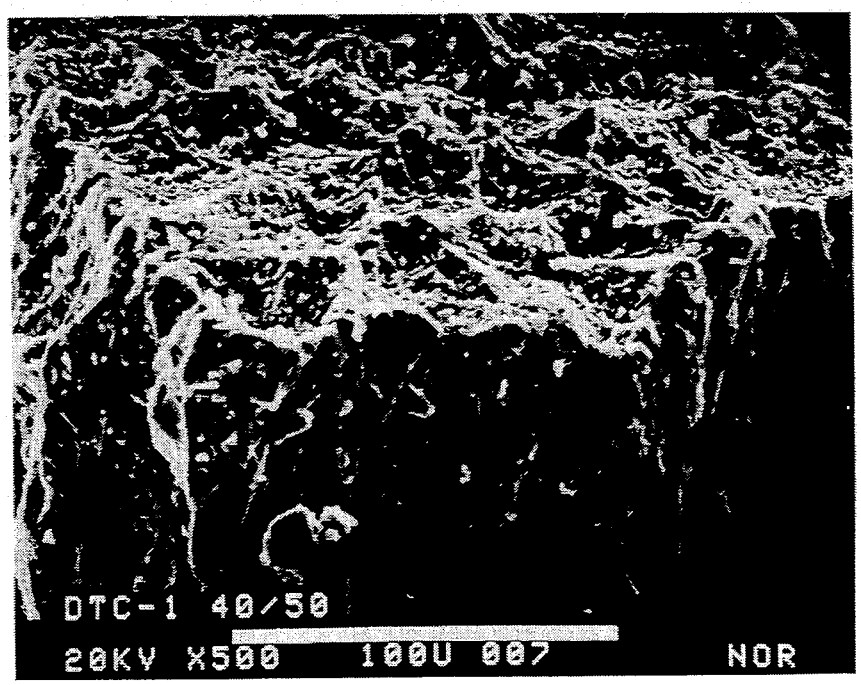

The strip 100 passes over a mandrel 130 and is wound on a take-up spool 140, which is driven by a motor 145. The height of mandrel 130 is controlled by a position controller 135, which may, for example, employ a hydraulic or mechanical type of drive. The motor 145 and the position controller 135 can be electrically controlled from outside the chamber via cables (not shown). The mandrel temperature is controlled by temperature controller 138, which can provide cooling or heating, depending on the type of deposition utilized, as will be described hereinbelow. For example, in conjunction with the arc plasma jet deposition apparatus described with reference to FIG. 2, a cooled mandrel may be used, whereas if a microwave plasma deposition apparatus is employed, as depicted in FIG. 4, a heated mandrel may be used. A CVD diamond deposition system 200 is mounted at the top of chamber 105. The chamber 105 may be formed, for example, of stainless steel, and the deposition apparatus can be bolted to the chamber or separately supported. A similar deposition apparatus that is movable in the chamber is disclosed in copending U.S. patent application Ser. No. 614,313, filed Nov. 15, 1990, now U.S. Pat. No. 5,310,512 and assigned to the same assignee as the present application.

Figure 2:
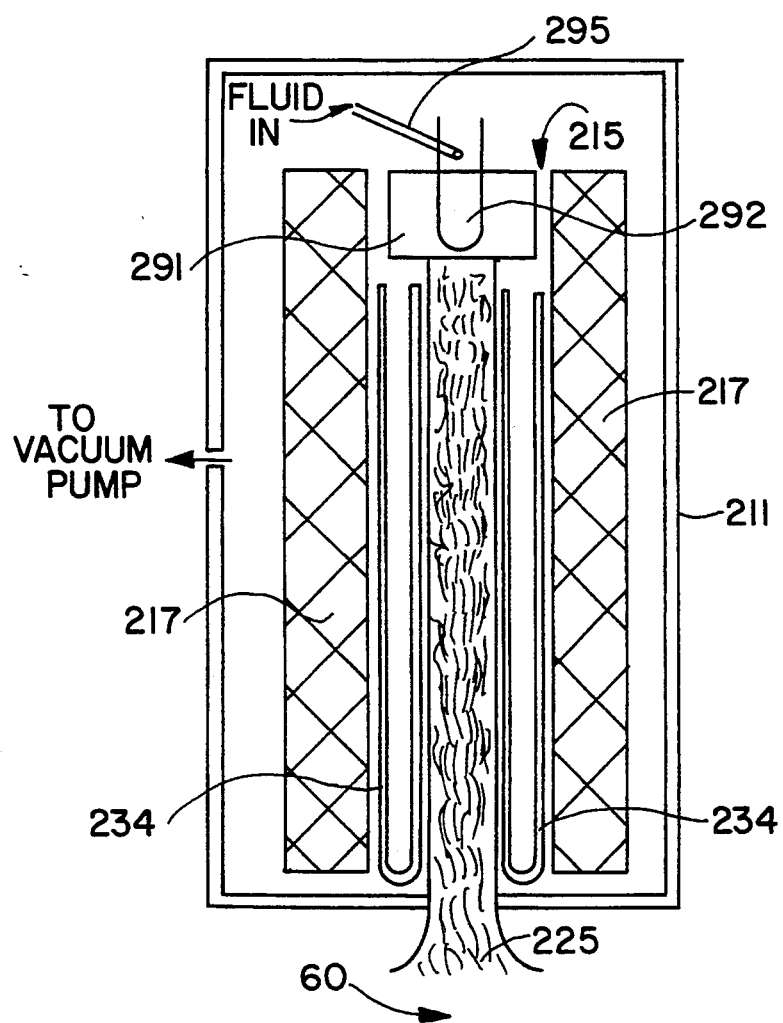
FIG. 2 shows a cross-section of an arc jet plasma deposition system which can be utilized in the FIG. 1 apparatus.

Referring to FIG. 2, there is shown a simplified diagram of a plasma jet deposition system 200 of a type which can be utilized in the FIG. 1 embodiment. Reference can also be made to U.S. Pat. Nos. 4,471,003 and 4,487,162. The system 200 is contained within a vacuum housing 211 and includes an arc-forming section 215 which comprises a cylindrical anode 291, a rod-like cathode 292, and an injector 295 mounted adjacent the cathode so as to permit injected fluid to pass over the cathode 292. In the illustrated embodiment the input fluid may be a mixture of hydrogen and methane. The anode 291 and cathode 292 are energized by a source of electric potential (not shown), for example a DC potential. Cylindrical magnets, designated by reference numeral 217, are utilized to accelerate and focus the plasma generated at the arc forming section. The magnets maintain the plasma within a narrow column until the plasma reaches the deposition region 60 (see also FIG. 1). Cooling coils 234, in which liquid nitrogen can be circulated, are located within the magnets and surround the focused plasma.

In operation, a mixture of hydrogen and methane is fed to the injector 295, and a plasma is obtained in front of the arc forming section and accelerated and focused toward the deposition region. The temperature and pressure at the plasma formation region are preferably in the approximate ranges 1500–2700 degrees C. and 100–700 torr, respectively, and in the deposition region are in the approximate ranges 800–1100 degrees C. and 10–200 torr, respectively. As is known in the art, synthetic polycrystalline diamond can be formed from the described plasma, as the carbon in the methane is selectively deposited as diamond, and the graphite which forms is dissipated by combination with the hydrogen facilitating gas. The rate of movement of the strip 100 (which can be moved continuously or in discrete steps) can depend on the rate of deposition and the desired thickness of the obtained polycrystalline diamond film. When the film is to be used to obtain grit in accordance with an embodiment of the invention, the preferred range of thickness is 10 to 1000 microns.

There are a number of ways in which the deposited diamond film can be removed from the strip. The strip can be flexed to remove the film (some breakage of which will have little consequence if the recovered film is to be crushed to obtain grit in accordance with a form of the invention). If desired, the strip can be pre-coated with a release agent such as magnesium oxide, aluminum oxide or other suitable ceramic or other material which will facilitate removal by flexing. Alternatively, a release agent can be used which is soluble in a solvent through which the strip is passed to dissolve the release agent and release the diamond film. A disposable strip or layer thereof could also be crushed with the diamond film and subsequently separated by chemical or other means. Also, a blade can be used, inside or outside the chamber, to "peel" or "shave" the deposited diamond coating from the strip. It will be understood that the described releasing techniques are exemplary, and others can be employed and can be based on other releasing parameters, such as temperature. Also, the apparatus and method of FIG. 1 can be utilized for making other superabrasive grit, such as by deposition of cBN, $C_3N_4$ or $B_2O$. Superabrasive material is intended to mean an abrasive having a Knoop hardness greater than about 3000 kg/mm$^2$.

The CVD diamond can be crushed by any suitable means, for example using a jet milling machine or a jaw crushing machine. Application of force generally in a direction parallel to the thickness direction of the film is preferred to effect separation of elongated grains, but is not essential. The grit so produced can be sized and bonded in known manner in matrix materials such as metal, glass, resin or ceramic.

It has been recognized in the art that diamond grit particles of relatively high length-to-width aspect ratio (e.g. particles as previously produced by HP-HT methods) have advantages of good retention in a binding matrix, good abrasive performance, and long wear life. [See, for example, De Beers publication "CDA-L".] It has been further recognized that the high aspect ratio particles (i.e., grains having an aspect ratio of about 2:1 or greater) can be advantageously oriented normal to the surface of a binding matrix by coating the particles with a magnetically susceptible material such as nickel or nickel alloy, applying a magnetic field, and causing the grit particles to fall freely in the field so that they land and adhere to the matrix oriented in the desired direction. Equipment for such procedure is known in the art (see e.g. the De Beers publication, supra) and includes, for example, a coil which produces an electromagnetic field surrounding a mold assembly. In accordance with the present invention, and as previously described, grit is obtained from CVD diamond which tends to grow in a columnar habit, and as it is ground into grit it tends to form acicular particles of high aspect ratio. Coating the particles, and then orienting the particles in a binding matrix results in useful abrasive media.

Figure 3:
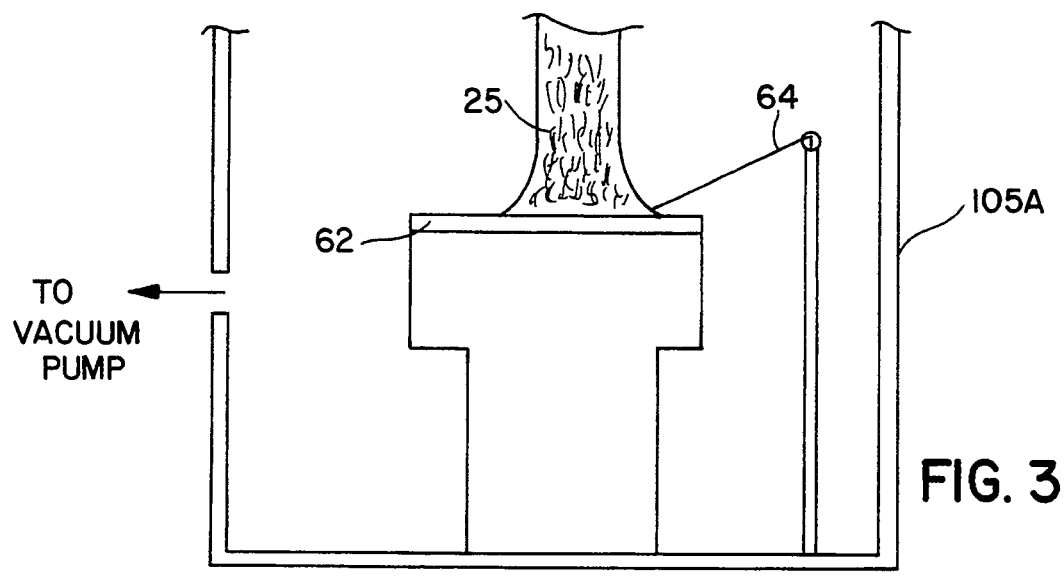
FIG. 3 illustrates a variation of the FIG. 2 system.

Diamond film can be produced for use as grit, as described hereinabove using the plasma jet deposition system of FIG. 1, but with a stationary substrate as illustrated in FIG. 3. FIG. 3 shows the bottom portion 105A of chamber 105 and a substrate or base 62, which may be of molybdenum, upon which the diamond film can be deposited. Mechanical means, such as arm 64, may be used to scrape diamond film from the base.

Referring to FIG. 4, there is illustrated another type of CVD deposition system 200B which can alternatively be utilized in the FIG. 1 embodiment. This deposition system operates on a microwave plasma principle, and reference can also be made to U.S. Pat. Nos. 4,507,588, 4,585,668, 4,630,566, and 4,691,662. The moveable strip is represented at 100, and is moveable over the mandrel 138 in the vacuum chamber (105B), as in FIG. 1. The means for moving the strip, adjusting the mandrel height, etc., can be similar to the FIG. 1 embodiment, and like reference numerals represented similar elements. A metal container 410 defines the walls of a microwave cavity 415, the top of which can be a plate 420, with brushes 425, that serves as an adjustable sliding short. An excitation probe 414 is provided, and its position within the cavity can be made adjustable. A quartz chamber or bell jar 435, which is used to contain a plasma 440, is mounted on a ring-shaped base 450 to which the vacuum chamber 105B and the microwave cavity 410 are attached. A gas injector 457 is used to feed the hydrocarbon and hydrogen mix into the plasma forming region through apertures indicated at 458. A cooling line 459 can be used to circulate a coolant to cool the base, or cooling coils (not shown) can be provided. Magnets, such as shown at 465, can be utilized to help confine the plasma. A disc-shaped metal grid 480, in conjunction with the strip and mandrel can be used to define part of the bottom of the microwave cavity, as shown. In operation, as the mixture of hydrogen and hydrocarbon is fed in, microwave energy in the cavity 415 creates the plasma 440 and, in known manner, polycrystalline diamond is deposited, the deposition being on the strip 100 (or a release agent carried on the strip, as previously described), in accordance with a form of the invention. In a microwave plasma apparatus it is generally beneficial to heat the substrate and, in this case, heating of the mandrel can be implemented by any suitable means; for example, with a carbon susceptor plate.

EXAMPLE

CVD diamond film was grown using an apparatus of the plasma jet deposition type illustrated in FIG. 1, but with a fixed substrate of molybdenum or other suitable material being utilized as illustrated in FIG. 3. The composition of the injected gas mixture was 0.5 percent methane and 99.5 percent hydrogen. The bulk gas temperature was about 2500 degrees K., and the substrate temperature was maintained at about 1000 degrees C. The deposition chamber pressure was about 200 torr. Deposition was at the rate of about 30 microns per hour, and a film of thickness of about 300 microns was obtained. The film was removed from the substrate and crushed in a mortar and pestle to obtain diamond grit. In this example, most of the grit ranged in size from 30 mesh to 60 mesh. The grit was screened to three size fractions: 30/40, 40/50, and 50/60. FIGS. 5, 6, 7 and 8 show scanning electron microscope pictures of the grit at magnifications of 20×, 40×, 100× and 500×, respectively. It can be seen from the SEM pictures that the grit was broken up from a film. For most of the grit particles, the top and bottom film surfaces are apparent and the film thickness tends to be the long dimension of the particles. The particles have a columnar, almost fibrous structure extending from the bottom to the top of the film, and it is apparent that grit size will tend to be controlled by selecting the thickness of the film. It is seen that the grit contains a substantial percentage of high aspect ratio grains.

We claim:

1. A method for making diamond grit, comprising the steps of:
   producing a diamond film by chemical vapor deposition; and
   crushing said film to obtain diamond grit.

2. The method as defined by claim 1, wherein said step of producing a diamond film comprises providing a substrate, generating a plasma comprising free carbon and atomic hydrogen, and exposing the substrate to the plasma.

3. The method as defined by claim 1, wherein said step of producing said diamond film comprises forming a film having a thickness in the range of 10 to 1000 microns.

4. The method as defined by claim 2, wherein said step of producing said diamond film comprises forming a film having a thickness in the range of 10 to 1000 microns.

5. The method as defined by claim 1, wherein said step of crushing the film comprises crushing said film to obtain grit particles, a substantial portion of which have an aspect ratio of at least 2:1.

6. The method as defined by claim 4, wherein said step of crushing the film comprises crushing said film to obtain grit particles, a substantial portion of which have an aspect ratio of at least 2:1.

7. The method as defined by claim 1, wherein said step of crushing said film comprises applying a force to said film in a direction substantially parallel to the thickness of said film.

8. The method as defined by claim 2, wherein said step of crushing said film comprises applying a force to said film in a direction substantially parallel to the thickness of said film.

9. A method of making an abrasive medium, comprising the steps of:
   producing a diamond film by chemical vapor deposition;
   crushing the film to obtain diamond grit;
   providing a matrix; and
   bonding the grit to the matrix.

10. The method as defined by claim 9, wherein said step of producing a diamond film comprises providing a substrate, generating a plasma comprising carbon and hydrogen, and exposing the substrate to the plasma.

11. The method as defined by claim 9, wherein said step of producing said diamond film comprises forming a film having a thickness in the range 10 to 1000 microns.

12. The method as defined by claim 8, wherein said step of crushing the film comprises crushing said film to obtain grit particles, a substantial portion of which have an aspect ratio of at least 2:1.

13. The method as defined by claim 9, wherein said step of crushing said film comprises applying a force to said film generally in a direction parallel to the thickness direction of said film.

14. The method as defined by claim 9, further comprising the steps of:
  coating particles of the grit with a magnetic material;
  aligning the coated grit particles with a magnetic field;
  and wherein said coated grit particles are bonded to said matrix while in the aligned condition.

15. The method as defined by claim 12, further comprising the steps of:
  coating particles of the grit with a magnetic material; and
  aligning the coated grit particles with a magnetic field;
  and wherein said coated grit particles are bonded to said matrix while in the aligned condition.

16. A method for making diamond grit, comprising the steps of:
  providing a chemical vapor deposition system;
  moving a carrier strip and the deposition system with respect to each other, and causing said system to deposit a film of a diamond material on said carrier strip;
  removing the film from the strip; and
  crushing the film to obtain the diamond grit.

17. The method as defined by claim 16, wherein moving step comprises moving an elongated strip of flexible material with respect to a stationary deposition system.

18. The method as defined by claim 16, wherein said carrier strip is of a flexible material, and wherein said step of removing the diamond film comprises flexing said strip.

19. The method as defined by claim 16, wherein said strip has a release agent upon which said film is deposited, and wherein the step of removing said film comprises causing release of said release agent.

* * * * *